United States Patent
Shiino et al.

(10) Patent No.: US 6,448,874 B1
(45) Date of Patent: Sep. 10, 2002

(54) RESONANT LINE CONSTRUCTED BY MICROSTRIP LINE WHICH IS EASY TO BE TRIMMED

(75) Inventors: Ikuhiro Shiino; Isao Ishigaki, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/499,485

(22) Filed: Feb. 7, 2000

(30) Foreign Application Priority Data

Feb. 8, 1999 (JP) .......................... 11-029741

(51) Int. Cl.⁷ .................. H01P 7/00; H01P 1/20; H01P 7/02; H01P 3/08
(52) U.S. Cl. ............... 333/219; 333/204; 333/221; 333/238; 333/246
(58) Field of Search ............... 333/219, 204, 333/246, 221, 238

(56) References Cited

U.S. PATENT DOCUMENTS 4,152,680 A * 5/1979 Harrison ............... 333/246
6,140,892 A * 10/2000 Uda et al. ............... 333/204

FOREIGN PATENT DOCUMENTS

| DE | 40 90 507 C2 | 4/1999 |
| JP | 10-56306 | 2/1998 |
| JP | 10-163715 | 6/1998 |

OTHER PUBLICATIONS

Pehl, E.: Mikrowellentechnik, 2$^{nd}$ ed., 1988, Dr. Alfred Hüthig Verlag Heidelbert, pp. 200, 201.

* cited by examiner

Primary Examiner—Robert Pascal
Assistant Examiner—Patricia Nguyen
(74) Attorney, Agent, or Firm—Brinks Hofer Gilson & Lione

(57) ABSTRACT

This resonant line comprises a plurality of microstrip lines. The length of each of the microstrip lines is set so that the reactance between one end of each of the microstrip lines and the ground is equivalently inductive and one ends of the microstrip lines are connected to each other.

4 Claims, 2 Drawing Sheets

US 6,448,874 B1

RESONANT LINE CONSTRUCTED BY MICROSTRIP LINE WHICH IS EASY TO BE TRIMMED

BACKGROUND OF THE INVENTION

1. Field of the Invention

The present invention relates to a resonant line for use in a resonance circuit such as a voltage controlled oscillator.

2. Description of the Related Art

The circuit of a voltage controlled oscillator is formed on a printed board, for example, as shown in FIG. 5. The collector of an oscillation transistor 11 is connected to the ground in a high frequency manner. A feedback capacitor 1 is provided between the base and emitter. A feedback capacitor 13 is provided between the emitter and ground. A microstrip line 14 serving as a resonant line is provided between the base and ground. The microstrip line 14 is formed by conductive foil or the like on a printed board (not shown). An oscillation frequency is changed by a varactor diode 15 connected in parallel with the microstrip line 14.

Since the microstrip line 14 is used as an inductance device in this case, one end is connected to the base side of the oscillation transistor 11 and the other end is connected to the ground. The length of the microstrip line 14 is set to the oscillation frequency, that is, a value shorter than a quarter of a wavelength at a resonance frequency determined by the feedback capacitors 12 and 13, microstrip line 14, varactor diode 15 and the like.

The oscillation frequency is adjusted by the microstrip line 14. At this time, generally, a part of the microstrip line 14 is trimmed so as to obtain a predetermined oscillation frequency in a state were a predetermined tuning voltage is applied to the varactor diode 15.

It is necessary to make the microstrip line shorter as the oscillation frequency of the voltage controlled oscillator is increased. Even when the microstrip line is trimmed slightly, however, the oscillation frequency largely changes and it is difficult to adjust the frequency to a target frequency.

SUMMARY OF THE INVENTION

It is therefore an object of the invention to provide a resonant line by which a frequency is easily adjusted even when it is used at a high oscillation frequency.

In order to achieve the object, a resonant line of the invention comprises a plurality of microstrip lines. The length of each of the microstrip lines is set so that the reactance between one end of the microstrip line and the ground is equivalently inductive at a predetermined frequency and one ends of the microstrip lines are connected to each other.

According to the resonant line of the invention, the length of each of the microstrip lines is set to a value shorter than a quarter of a wavelength at a predetermined frequency and the other end of each of the microstrip lines is connected to the ground.

According to the resonant line of the invention, the length of at least one of the plurality of microstrip lines is set to a value longer than a quarter of a wavelength at a predetermined frequency and shorter than a half of the wavelength, the other end of the microstrip line is opened, the length of the other microstrip line is set to a value shorter than a quarter of the wavelength, and the other end of the other microstrip line is connected to the ground.

According to the resonant line of the invention, the length of each of the microstrip lines is set to a value longer than a quarter of a wavelength at a predetermined frequency and shorter than a half of the wavelength, the other end of the microstrip line is connected to the ground, and a concentrated constant device serving as an inductance device is connected in parallel with the plurality of microstrip lines.

According to the invention, there is also provided a resonant line comprising a plurality of first microstrip lines which have the same length and are connected in parallel with each other and a second microstrip line connected to one end of each of the plurality of microstrip lines, wherein when the length of each of the first microstrip lines is L1, the length of the second microstrip line is L2, and the number of the first microstrip lines is N, L1/N+L2 is set to a value shorter than a quarter of the wavelength at a predetermined frequency.

DETAILED DESCRIPTION OF THE PREFERRED EMBODIMENT

Figure 1:
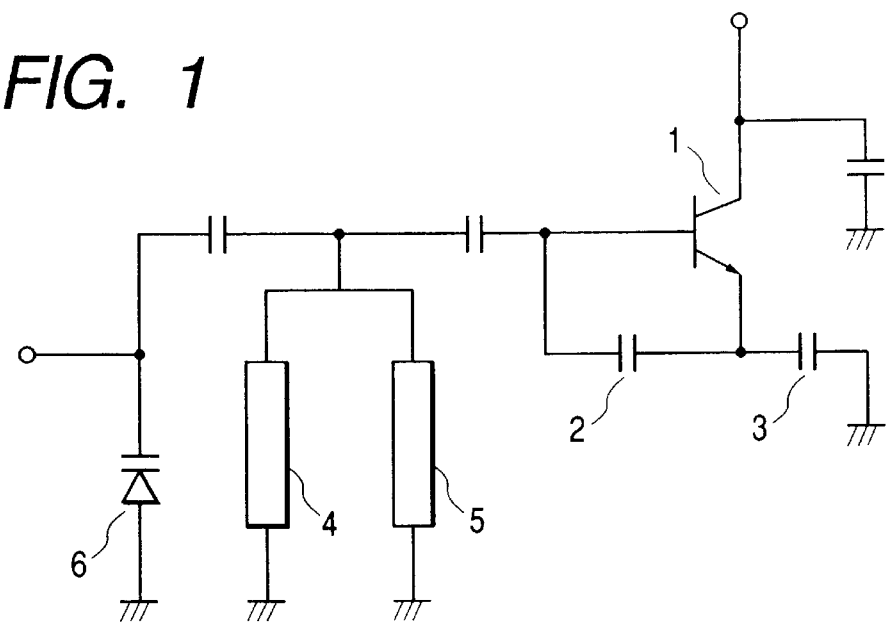
FIG. 1 is a circuit diagram of a voltage controlled oscillator using a resonant line of the invention.

The circuit of a voltage controlled oscillator using the resonant line of the invention will be described with reference to FIG. 1. The circuit of the voltage controlled oscillator is formed on a printed board (not shown). The collector of an oscillation transistor 1 is connected to the ground in a high frequency manner. A feedback capacitor 2 is provided between the base and emitter and a feedback capacitor 3 is provided between the emitter and ground. For example, two microstrip lines 4 and 5 as resonant lines are provided between the base and the ground. The microstrip lines 4 and 5 are formed by conductive foil or the like on a printed board (not shown). The oscillation frequency is changed by a varactor diode 6 connected in parallel with the microstrip lines 4 and 5.

One end of each of the two microstrip lines 4 and 5 are connected to each other. Since the parts between the mutually connected ends and the ground are used so as to be equivalent to an inductance device, the length of each microstrip line is set to a value shorter than a quarter of a wavelength at the oscillation frequency, the mutually connected ends are connected to the base side of an oscillation transistor 1 and the other ends are connected to the ground. As a result, since the microstrip lines 4 and 5 are connected in parallel, the effective length of the microstrip lines 4 and 5 is longer than the length of a conventional microstrip line.

The oscillation frequency is adjusted by trimming one of the microstrip lines (for example, the microstrip line 4). In this case, a part of the microstrip line 4 is trimmed so as to obtain a predetermined oscillation frequency when a predetermined tuning voltage is applied to the varactor diode 6. Since the microstrip line 4 is long, the change in the frequency to the trimming is gentle so that the adjustment is performed easier.

Figure 2:
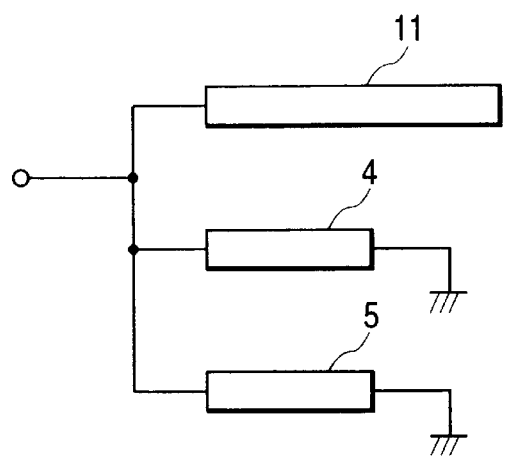
FIG. 2 is a diagram showing a configuration of a resonant line of the invention.
Figure 3:
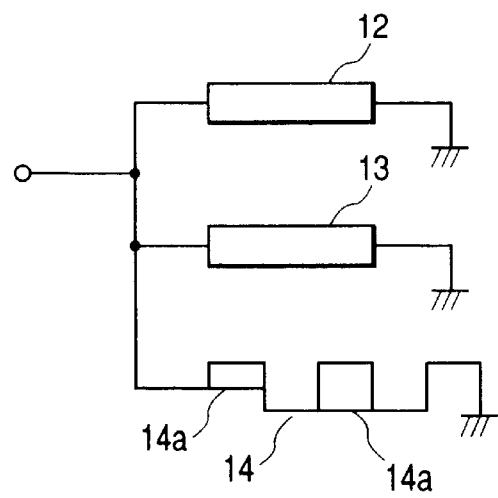
FIG. 3 is a diagram showing another configuration of the resonant line of the invention.
Figure 4:
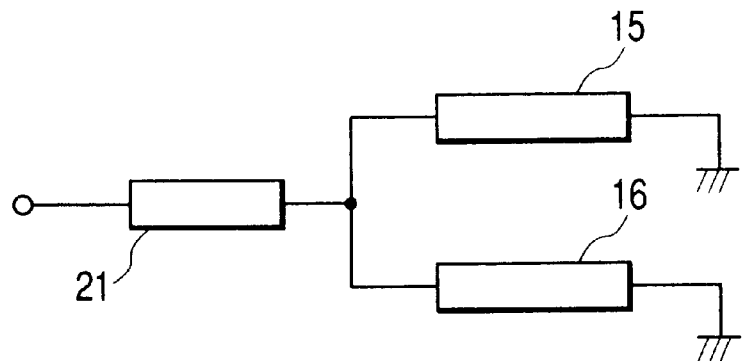
FIG. 4 is a diagram showing another configuration of the resonant line of the invention
Figure 5:
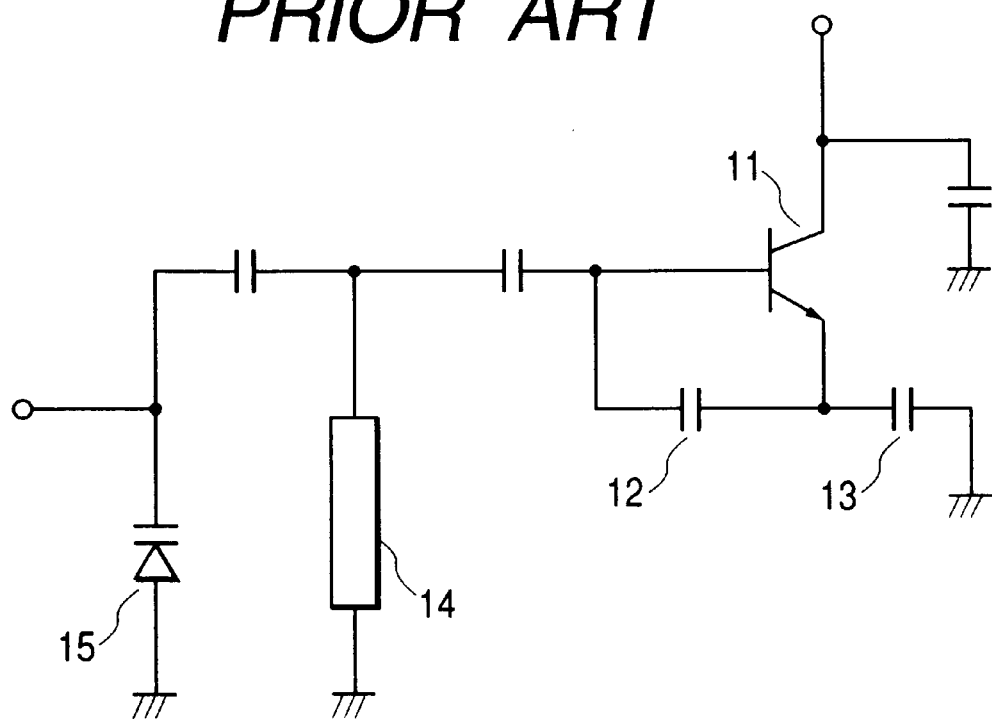
FIG. 5 is a circuit diagram of a voltage controlled oscillator using a conventional resonant line.

FIGS. 2 to 4 show other configuration examples of the resonant line of the invention. In FIG. 2, the microstrip lines 4 and 5, whose other ends are connected to the ground and a microstrip line one end of which is connected in with microstrip lines 4 and 5 and the other end of which is open are provided in parallel. Since the other end of the microstrip line 11 is open, the microstrip line 11 is set to be longer than a quarter of the wavelength and shorter than a half of the wavelength. By the arrangement, the microstrip line 11 becomes inductive when it is seen from one end. All of the three microstrip lines 4, 5, and 11 are therefore equivalent to inductance devices. When they are in a parallel state, a predetermined inductance value is obtained. The length of the three microstrip lines 4, 5, and 11 is therefore longer. The length of each of the microstrip lines 4 and 5 has to be equal to or shorter than a quarter of the wavelength. The microstrip line 11 has to be set longer than a quarter of the wavelength and shorter than half wavelength.

The adjustment of the frequency in this case is made easier, for example, when a part of the long microstrip line 11 is trimmed since the change in frequency is gentler.

In FIG. 3, inductance means which can be regarded as a concentrated constant such as a print coil 14 or the like formed on the printed board is connected in parallel with the two microstrip lines 12 and 13 all of whose other ends are connected to the ground. Each of the two microstrip lines is set to be longer than a quarter of the wavelength and shorter than a half of the wavelength so as to be capacitive. The print coil 14 and the two microstrip lines 12 and 13 are connected in parallel so as to be equivalently inductive at a predetermined frequency.

The print coil 14 is formed in a zigzag shape. By cutting a short-circuited side 14a, the length of the print coil 14 is changed and the inductance is accordingly changed. In such a manner, the frequency is easily adjusted by the print coil 14.

In FIG. 4, a second microstrip line 21 is connected in series with a first plurality of microstrip lines 15 and 16 whose other ends are connected to the ground. The length of the microstrip line 15 and that of the microstrip line 16 are equal to each other. When the length of each of the first microstrip lines 15 and 16 is L1 and the length of the second microstrip line 21 is L2, L1/2+L2 is set to be shorter than a quarter of the wavelength. When seen from one end of the microstrip line 21, it is inductive.

Although the two first microstrip lines 15 and 16 are provided in FIG. 4, the number of the first microstrip lines can be further increased to N. In this case, it is sufficient that L1/N+L2 is set to be shorter than a quarter of the wavelength.

As described above, the resonant line of the invention has a plurality of microstrip lines. Each of the microstrip lines is set to the length so that the reactance between one end of each microstrip line and the ground is equivalently inductive at a predetermined frequency and one ends of the microstrip lines are connected to each other. Consequently, the length of one microstrip line becomes longer when the microstrip line is used at the same frequency. It makes the adjustment of the frequency by trimming a part of the microstrip line easy.

According to the resonant line of the invention, since the length of each microstrip line is set to a value shorter than a quarter of a wavelength at a predetermined frequency and the other end of each microstrip line is connected to the ground, all of the microstrip lines become inductive. The length of the microstrip line becomes longer, so that it makes the adjustment of the frequency by trimming a part easier.

According to the resonant line of the invention, the length of one of the plurality of microstrip lines is set to be longer than a quarter of a wavelength at a predetermined frequency and shorter than a half of the wavelength, the other ends are opened, the length of each of the other microstrip lines is set to a value shorter than a quarter of the wavelength, and the other end is connected to the ground.

According to the resonant line of the invention, the length of each microstrip line is set to a value longer than a quarter of a wavelength at a predetermined frequency and shorter than a half of the wavelength, the other end is connected to the ground, and a concentrated constant device as an inductance device is connected in parallel with a plurality of microstrip lines. Consequently, the concentrated constant device can take the form of a print coil or the like. By changing the length of the print coil, the inductance of the whole can be easily adjusted. The length of the microstrip line becomes longer, so that it makes the adjustment of the frequency by cutting a part of the microstrip line easier.

The resonant line of the invention comprises a plurality of first microstrip lines which have the same length and are connected in parallel with each other and a second microstrip line connected to one end of each of the plurality of first microstrip lines. When the length of each of the first microstrip lines is set to L1, the length of the second microstrip line is set to L2, and the number of the first microstrip lines is set to N, L1/N+L2 is set to a value which is shorter than a quarter of a wavelength at a predetermined frequency. Consequently, the first microstrip lines become longer. Similarly, it makes the trimming of a part of the microstrip line easier and the adjustment of the frequency easier.

What is claimed is:

1. A resonant line comprising a plurality of microstrip lines, wherein one end of each of said plurality of microstrip lines are connected to each other, the length of at least one of said plurality of microstrip lines is set to a value longer than a quarter of a wavelength at a predetermined frequency and shorter than a half of the wavelength, the other end of said at least one of the microstrip lines is opened, the length of another of the microstrip line is set to a value shorter than a quarter of the wavelength, and the other end of said another of the microstrip lines is connected to a ground, and the length of each of said plurality of microstrip lines is set so that the reactance between said one end of the microstrip line and the ground is equivalently inductive at a predetermined frequency.

2. A resonant line comprising a plurality of microstrip lines and a print coil, wherein one end of each of said plurality of microstrip lines are connected to each other, the length of each of said plurality of microstrip lines is set to a value longer than a quarter of a wavelength at a predetermined frequency and shorter than a half of the wavelength, the other end of each of the microstrip lines are connected to a ground, said print coil is connected in parallel with said plurality of microstrip lines, and the length of each of said plurality of microstrip lines is set so that the reactance between said one end of the microstrip line and the ground is equivalently inductive at a predetermined frequency.

3. A resonant line comprising a plurality of first microstrip lines which have the same length and are connected in parallel with each other and a second microstrip line connected to one end of each of said plurality of first microstrip lines, wherein the other ends of said plurality of first microstrip lines are connected to a ground, when the length of each of the first microstrip lines is L1, the length of the second microstrip line is L2, and the number of the first microstrip lines is N, L1/N+L2 is set to a value shorter than a quarter of the wavelength at a predetermined frequency, and the lengths of said plurality of first microstrip lines and said second microstrip line are set so that the reactance between the other end of said second microstrip line and the ground is equivalently inductive at a predetermined frequency.

4. A resonant line according to claim 2, wherein said print coil is formed in a zigzaq shape and includes a short-circuited side, and said short-circuited side is cut so as to change the inductance, thereby easily adjusting the frequency.

* * * * *